(12) United States Patent
Casto et al.

(10) Patent No.: US 7,848,115 B2
(45) Date of Patent: Dec. 7, 2010

(54) SYSTEMS FOR ELECTRICALLY CONNECTING CIRCUIT BOARD BASED ELECTRONIC DEVICES

(75) Inventors: Brian W. Casto, Copley, OH (US); John J. Retterer, Marion, OH (US); Thomas L. Smith, Silver Lake, OH (US)

(73) Assignee: ICI Networks, LLC, Akron, OH (US)

( * ) Notice: Subject to any disclaimer, the term of this patent is extended or adjusted under 35 U.S.C. 154(b) by 854 days.

(21) Appl. No.: 11/586,912

(22) Filed: Oct. 26, 2006

(65) Prior Publication Data

US 2008/0101049 A1    May 1, 2008

(51) Int. Cl.
*H01R 12/16*     (2006.01)
(52) U.S. Cl. .................. 361/788; 361/796; 361/802
(58) Field of Classification Search .......... 361/788, 361/796–802; 710/300–305
See application file for complete search history.

(56) References Cited

U.S. PATENT DOCUMENTS

| | | | | |
|---|---|---|---|---|
| 5,754,796 A | * | 5/1998 | Wang et al. | 710/301 |
| 6,166,919 A | * | 12/2000 | Nicolici et al. | 361/800 |
| 6,202,110 B1 | * | 3/2001 | Coteus et al. | 710/301 |
| 6,533,587 B1 | * | 3/2003 | Potter et al. | 439/65 |
| 6,731,515 B2 | * | 5/2004 | Rhoads | 361/796 |
| 6,909,614 B2 | | 6/2005 | Beihoff et al. | |

* cited by examiner

*Primary Examiner*—Tuan T Dinh
(74) *Attorney, Agent, or Firm*—Calfee, Halter & Griswold LLP

(57) ABSTRACT

In one exemplary embodiment, a system for supplying electrical connectivity to one or more circuit board based devices includes a backplane and at least one module. The backplane includes a mounting surface having a plurality of modular power connectors. The at least one module includes an interface portion, a power connection portion, and a circuit board. The power connection portion is configured to connect with the corresponding one of the plurality of modular power connectors. The circuit board includes a plurality of power-related electrical contacts and a plurality of data-related electrical contacts. At least one of the plurality of power-related electrical contacts is connected with the power connection portion, and at least one of the plurality of data-related electrical contacts is connected with the interface portion. The backplane is configured to connect with a power supply, such that the power supply supplies power to the at least one module through one of the modular power connectors when the at least one module is connected with the corresponding modular power connector.

17 Claims, 6 Drawing Sheets

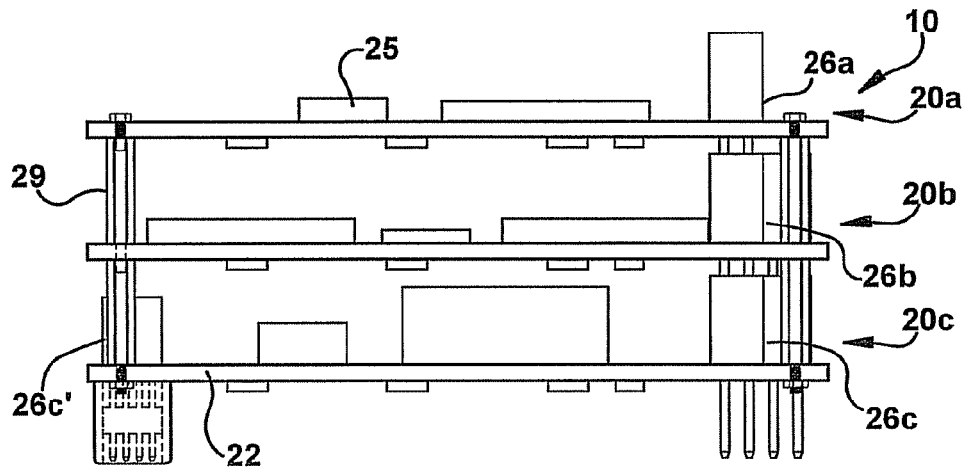
Fig. 1A
PRIOR ART
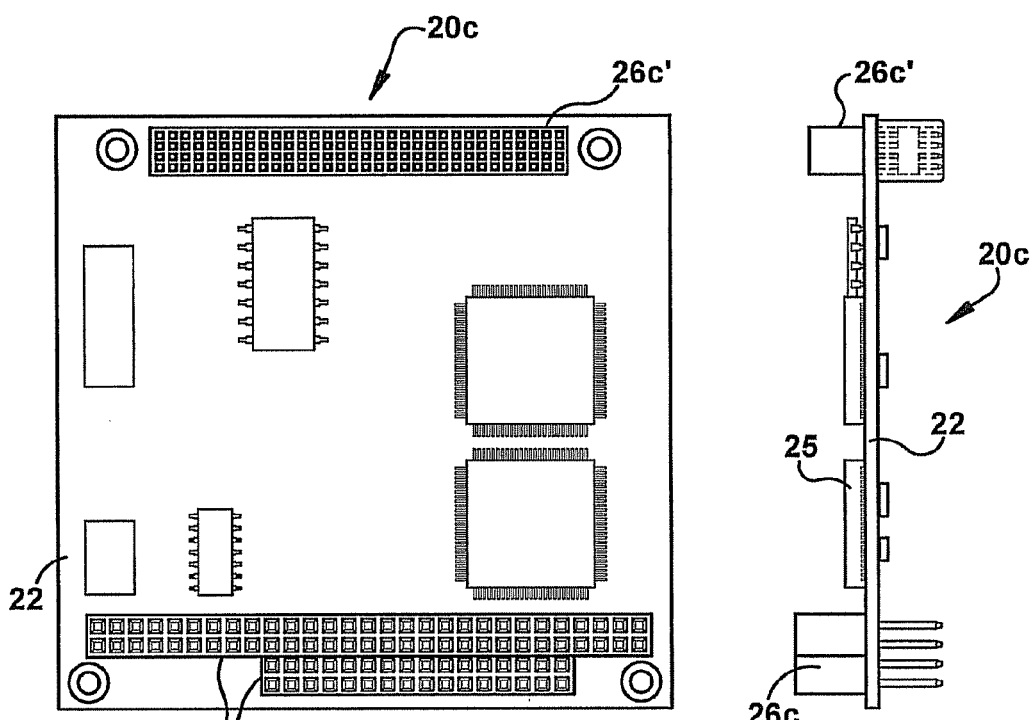
Fig. 1B
PRIOR ART
Fig. 1C
PRIOR ART

SYSTEMS FOR ELECTRICALLY CONNECTING CIRCUIT BOARD BASED ELECTRONIC DEVICES

FIELD OF THE INVENTION

The present invention relates to a system for electrically connecting circuit board based electronic devices.

BACKGROUND OF THE INVENTION

With advancement in computer-based technologies, such as data communications (including wireless communication), the interconnectivity of multiple electronic devices in data communications systems has become a priority for the manufacturers and users of these system components. Devices such as, for example, PCs, video cameras, radio transmitters, and modems are required to work together, with the help of various adapters, processors, routers, and interfaces, for the efficient and effective operation of the data communications system. Due to the large number of hardware manufacturers, software developers, and service providers, this interconnectivity may be challenging or even prohibitive when assembling a data communications system.

In an effort to provide a compact, powerful, and adaptable format for PC-compatible devices, a standard was developed to use small (3.6"×3.8"), self-stacking 104-pin modules to allow for power sharing and communication between the modules. The format, known as PC/104 (based on its PC architecture and 104-pin configuration), established standards for mechanical pin and socket configurations and software used, as well as dimensional and electrical parameters, thus facilitating the combination of multiple modular devices into a relatively small and compact (0.6" between device circuit boards), embedded interactive system, to support, for example, a wireless communication system.

FIG. 1A illustrates a side schematic view of an exemplary stack 10 of PC/104 based modules, including three different (but compatible) types of PC/104 architecture. The exemplary stack includes one 8-bit PC/104 module 20a, one 16-bit PC/104 module 20b, and one 32 bit PC/104-Plus module 20c. Each module 20a, 20b, 20c includes a printed circuit board 22 carrying a device 25, such as, for example, a modem, router, transmitter, or processor. The modules are connected with each other by pin and socket connectors. The 8-bit PC/104 module 20a includes a 64-pin ISA bus connector 26a, the 16-bit PC/104 module 20b includes a 104-pin ISA bus connector 26b, and the PC/104-Plus module 20c includes both a 104-pin ISA bus connector 26c and a 120-pin PCI bus connector 26c', as shown more clearly in FIGS. 1B and 1C. Additionally, spacers 29 may be provided to add support to the modules and maintain proper spacing between the boards.

To connect the PC/104 stack 10 with an external device (not shown), such as, for example, a power or data source, one or more of the modules 20a, 20b, 20c are connected with the external device by way of the pin and socket bus connectors 26a, 26c, 26c' of one of the end-most modules 20a, 20c of the stack 10, or by way of other or by some other connector extending from the module (not shown). As interconnectivity is provided between the stacked modules, only one of the modules may need to be connected to the external device.

While the self-stacking arrangement and limited external connectivity of the stack may make construction of such systems easier and more efficient, the manufacturer "bundling" of these modules may present difficulties with regard to end user modifications and servicing of any one or more of the modules. For example, maintenance or replacement of one module in the stack, particularly a module in the middle of the stack or a module to which an external device is connected, may require physical removal of the entire stack of modules and separation of devices from each other to perform such modifications. This may result in extended system downtime, maintenance hazards (particularly for systems in hazardous locations, such as utility poles), risk of improper reassembly, damage during disassembly/reassembly, diagnostic issues, and other difficulties. Even maintenance on an end-most module on a stack may require removal of the entire stack, due to space constraints within the enclosure that houses the stack. Further, even if maintenance of a module does not require removal of the stack, a network interruption of one or more of the remaining module devices may be necessary due to the data signal interconnectivity of all of the modules in the stack. This data signal interconnectivity may also result in potential bus signal conflicts between module devices in the stack, which may limit a user's options in adapting the assembly by replacing or adding electronic devices on the stack.

SUMMARY OF THE INVENTION

According to one inventive aspect of the present application, a system may include a power backplane provided to supply modular power connectors for a plurality of modular devices. By providing a separate power connector for each modular device, the system may be configured to allow removal of any one or more of the modular devices from the system without requiring physical removal and/or network interruption of any or all of the remaining devices, as is the case with a conventional self-stacking configuration.

According to another inventive aspect of the present application, a system may include a plurality of modular devices, with each modular device including a circuit board having electrical contacts connected to an interface portion. The interface portions of the devices may be indirectly connected with each other, using, for example, cables or other such connections. By providing modular devices that are not directly connected with each other, the system may be configured to allow removal or installation of any one or more of the modular devices, such as for repair, replacement, or new installation, from the system without requiring physical removal and/or network interruption of any or all of the remaining devices, as is the case with a conventional self-stacking modular configuration. Also, by limiting data signal interconnectivity between devices in a system, signal conflicts, such as between incompatible devices, may be avoided.

Accordingly, in one exemplary embodiment, a system for supplying electrical connectivity to one or more circuit board based devices includes a backplane and at least one module. The backplane includes a mounting surface having a plurality of modular power connectors. The at least one module includes an interface portion, a power connection portion, and a circuit board. The power connection portion is configured to connect with the corresponding one of the plurality of modular power connectors. The circuit board includes a plurality of power-related electrical contacts and a plurality of data-related electrical contacts. One example of such a circuit board is a PC/104 compliant circuit board, in which the electrical contacts include a series of pins and sockets for providing power and data related connections. At least one of the plurality of power-related electrical contacts is connected with the power connection portion, and at least one of the plurality of data-related electrical contacts is connected with the interface portion. The backplane is configured to connect with a power supply, such that the power supply supplies power to the at least one module through one of the modular power connectors when the at least one module is connected with the corresponding modular power connector.

In another exemplary embodiment, a wireless network base station includes a vertical power backplane to which a series of wireless network related PC/104 based electronic devices are horizontally connected to comprise a wireless network. The exemplary backplane is configured to supply power to each of the connected electronic devices. The exemplary electronic devices are each provided with an interface portion to provide data signal connectivity and/or visual diagnostic features. Certain of the modular PC/104 based electronic devices may be selectively connected with each other by providing connections, such as with cables, between the corresponding interface portions.

BRIEF DESCRIPTION OF THE DRAWINGS

Further features and advantages of the invention will become apparent from the following detailed description made with reference to the accompanying drawings, wherein:

FIG. 1A illustrates a side view of an exemplary stack of PC/104 based modular devices;

FIG. 1B illustrates a top view of a PC/104-Plus device;

FIG. 1C illustrates a side view of the PC/104-Plus device of FIG. 1B;

DETAILED DESCRIPTION OF THE INVENTION

Figure 2:
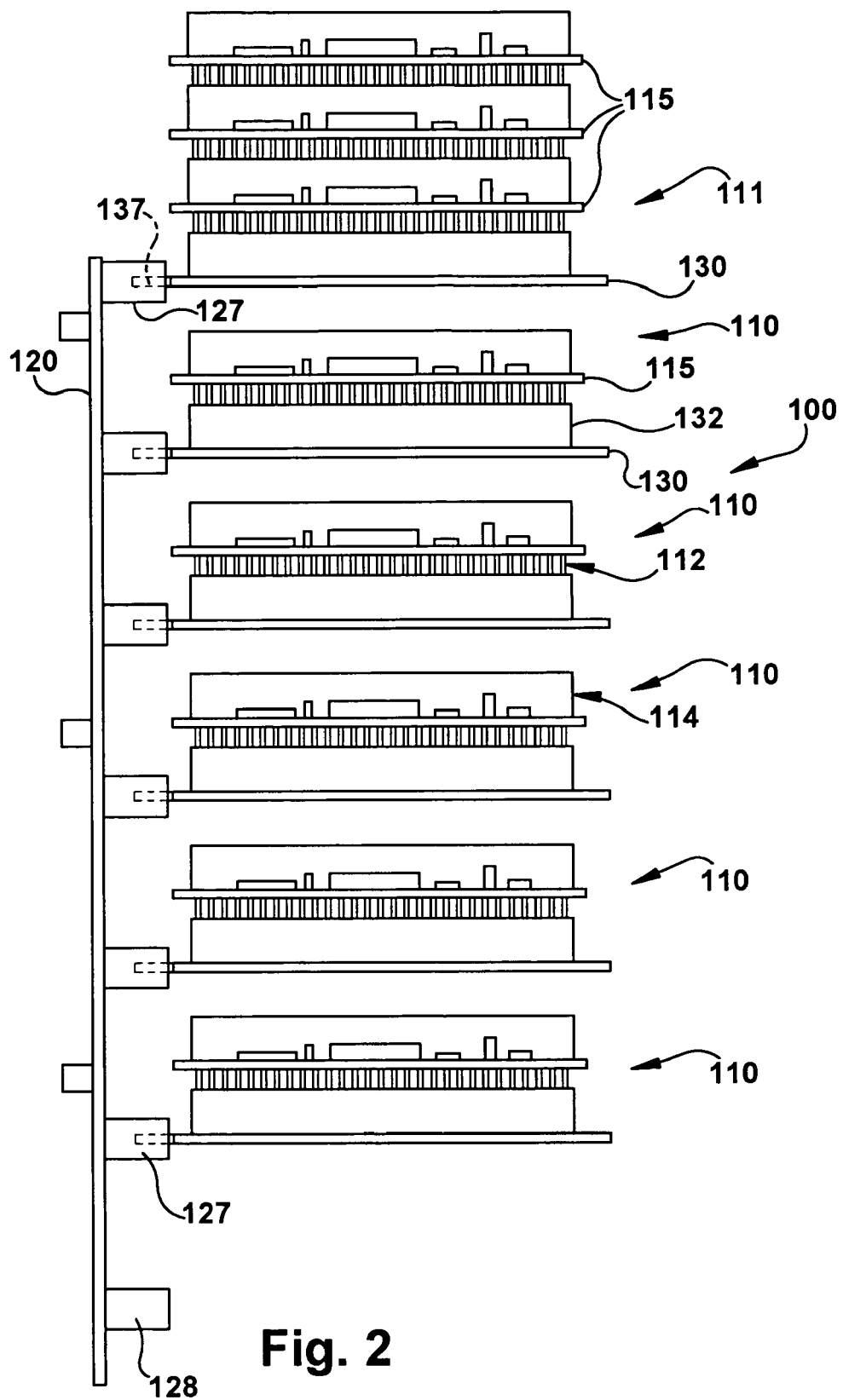
FIG. 2 is a side schematic view of a modular electronic system.

This Detailed Description of the Invention merely describes preferred embodiments of the invention and is not intended to limit the scope of the claims in any way. Indeed, the invention as described is broader than and unlimited by the preferred embodiments, and the terms used have their full ordinary meaning.

The present application relates to arrangements for providing electrical connectivity to multiple electronic devices. According to one inventive aspect, a power backplane is used to provide separate modular power connectors for each of the electronic devices in the system. While some embodiments may include a backplane providing both power connectivity and data signal connectivity to the multiple electronic devices, in one embodiment, power connectivity alone may be provided through the backplane, with data signal connectivity being provided by some other means, such as, for example, external cable connections between the modular devices. In one example of such an embodiment, the system may be configured such that when one electronic device is removed from the system (and detached from the backplane), power is still supplied to the remaining electronic devices still connected with the backplane. This may allow for replacement of one device in the system without having to power down the entire system or interrupt the functionality of all other devices in the system, a practice referred to as "hot swapping." By separating power supply connectivity to and from the electronic devices from data exchange connectivity between the electronic devices, removal, servicing, and/or replacement of any of the electronic devices in a system may be facilitated.

According to another inventive aspect, electronic devices used in a system, such as PC/104 based devices, may be configured as separate modules not directly connected with each other. This may also facilitate removal (and servicing or replacement) of one device in the system without having to remove or disconnect other devices in the system. In one such embodiment the separate modules may be adapted to connect perpendicularly with a power backplane, allowing the modules to remain in a stacked (but not directly connected) orientation. In an exemplary embodiment, electronic devices of a self-stacking or interconnecting format (such as devices made to the PC/104 standard) may be maintained as separate (or non-directly connected) devices adapted to utilize external connections, such as cables, to connect the devices with each other, for example, for the exchange of data signals. To accommodate this type of external or non-direct connection between the devices, the devices may be provided with an interface portion to which an operating portion of the device, such as a circuit board, is connected. By providing any number of communication ports on the interface portion, such as, for example, serial ports, RF ports, and Ethernet ports, the devices may be quickly and easily connected and disconnected from each other using the proper cables, allowing for removal of one device without removing other devices from the system. As another advantage over a self-stacked or interconnected system bus, such as a PC/104 system bus, a user may provide selective connectivity between one or more of the devices in the system, thereby preventing connectivity between two devices that may be incompatible with each other due to, for example, signaling conflicts.

While the examples illustrated and described herein refer specifically to devices in compliance with the PC/104 small form factor standard, it will be apparent to those skilled in the art that the inventive aspects described herein may be applied to systems using many types of devices in many different electronic, mechanical, dimensional, and software formats. Examples of other formats for electronic devices include, for example, other PCI form factors, such as PMC and Compact-PCI. As used herein, PC/104 is intended to describe system components in compliance with PC/104 (both 8-bit and 16-bit), PC/104-Plus (a PCI implementation on a stackable board that maintains the small form factor), PCI-104 (a PCI only implementation without ISA bus support that maintains the self-stacking and small form factor standards), and any other derivations of the PC/104 format.

FIG. 2 illustrates a side view of a modular electronic system 100 according to an exemplary embodiment of the present application. Exemplary modules 110, 111 separably connect with power backplane 120 at modular power connectors 127 to provide a power supply to each of the modules 110, 111. While the exemplary backplane 120 provides six modular power connectors 127 for connection with up to six modules, any number of power connectors may be provided to accommodate a desired number of modules. Also, while the modules 110, 111 and backplane 120 are configured such that the connected modules are perpendicular to the backplane, the power connectors 127 may be configured to provide a different angle and orientation for the connected modules, for example, to accommodate space considerations.

The modules 110, 111 include circuit boards 115 having a plurality of electrical contacts (e.g., pins 12 or sockets 132). While various types of electrical contacts may be used, the exemplary circuit boards 115, consistent with the PC/104-Plus format, include 224 pins 112 (104 pins associated with an ISA bus connection and 120 pins associated with a PCI bus connection) extending from a first side of the circuit board and 224 sockets 114 extending from a second side of the circuit board. While the pins 112 of a first PC/104 device are connected with the sockets of an adjacent device in a conventional PC/104 system, as shown, for example, in FIG. 1A, the modules 110, 111 of the exemplary system 100 remain separate from each other to facilitate removal or installation of a module into the system 100 without having to remove multiple interconnected modules.

In the exemplary circuit boards, consistent with the PC/104 standard, some of the electrical contacts are associated with power supply, delivering power to or from the circuit board, while other electrical contacts are associated with data communication, delivering data signals to or from the circuit board. Many different mechanisms may be used for connecting the circuit board electrical contacts associated with power supply to the backplane power connectors, including, for example, cable or wiring connections. In one embodiment, an adapter card or circuit board may be connected to at least the electrical contacts associated with the power supply. The adapter card may include mapped leads to connect these power related electrical contacts with the modular power connected through a power connection portion attached to the adapter card.

In the illustrated embodiment, the circuit boards 115 are assembled with modular adapter cards 130 to provide a power connection with the backplane 120. The exemplary modular adapter cards 130 include sockets 132 that connect with the pins 112 on the corresponding circuit board 115. In another embodiment (not shown), a modular adapter card may include pins that connect with the sockets 114 on the corresponding circuit board. The modular adapter card 130 further includes electrical leads (not shown) extending from the sockets 132 to a modular power connector 137 extending from the card. While many different types of connectors may be used, the exemplary connector 137 includes a card edge type connector receivable in a corresponding slot-type modular power connector 127 on the backplane 120.

As described above, the power backplane 120 is configured to provide at least electrical connectivity between the modules 110, 111 and a power supply. As such, sockets 132 on the adapter card need only be provided for connection with power-related circuit board pins 112, that is, pins associated with power supply, including grounding pins. However, a full set of PC/104 or PC/104-Plus sockets 132 may also be used, for example, due to availability or for additional mechanical support between the circuit board 115 and the adapter card 130. Further, leads on the adapter card 130 and connector 137 may be limited to connections between sockets 132 for the power-related pins 112 and the connector 137. However, in other embodiments, the adapter card 130 may include leads (not shown) extending from sockets for assembly with some or all of the data-related pins 112 on the circuit board 115, thereby allowing the backplane 120 to provide data interconnectivity between the separate modules 110, 111.

In one exemplary embodiment, leads associated with the grounding pins on a circuit board 115 extend beyond leads associated with the power supply pins on the card edge type connection 137, such that as the modular device 110 is being connected with the backplane 120, the device 110 may be grounded before it is electrically connected with the associated power supply.

To supply power to the modules 110, 111 through the backplane 120, the backplane may be provided with a separate power port 128 to which the power supply may be connected. The power port may be electrically connected, for example, in parallel, with the modular power connections on the backplane to supply power to each of the modules. Many different types of connection ports and power supplies may be used to provide power to the backplane. In the exemplary embodiment, an ATX-type power port 128 is provided on the backplane 120 for connection with an ATX-type power supply. ATX power supplies are inexpensive, readily available, rated for a temperature range (0-55° C.) that is adequate for most applications, and capable of handling up to 34 A at +12 VDC, up to 36 A at +5 VDC, and up to 27 A at +3.3 VDC, sufficient to support the parameters of PC/104 system components. In applications where exposure to extreme temperatures may be a concern, alternative power supplies with different temperature ratings may be used. Also, the system may be provided with a thermostat and cooling or heating units, as known in the art, to maintain a temperature within a desired range.

In another embodiment, a modular power supply, such as a PC/104-type power supply, may be connected to one of the modular power connectors 127 on the backplane 120. By providing parallel connections between the modular power connectors 127 on the backplane 120, the modular power supply assembled with the backplane 120 may supply power to each of the other modules 110, 111 assembled with the backplane, and an additional power port 128 on the backplane need not (but may still) be provided. In yet another embodiment, a system may be provided with a first power supply connected to the backplane at a dedicated power port 128, such as an ATX power supply, and a second, modular power supply connected to one of the modular power connectors of the backplane. The second power supply may be used, for example, to provide additional power or isolated power to the other modules assembled with the system, or to provide a power supply to devices external to the system.

In one embodiment, as shown, for example, in FIG. 2, the modules 110, 111 in a system may be provided without enclosures, essentially being limited to a circuit-board based device, and any necessary connections (such as wiring or adapter cards) between the device and the backplane and between two or more of the modules. Spacers, similar to the spacers 29 of FIG. 1A, may be used between the modules to provide structural support for, and proper spacing between, the modules within the system. In another embodiment, each of the modules may include an external housing or chassis, which encloses the device and the internal connections, providing protection and structural support for the internal components.

Figure 3:
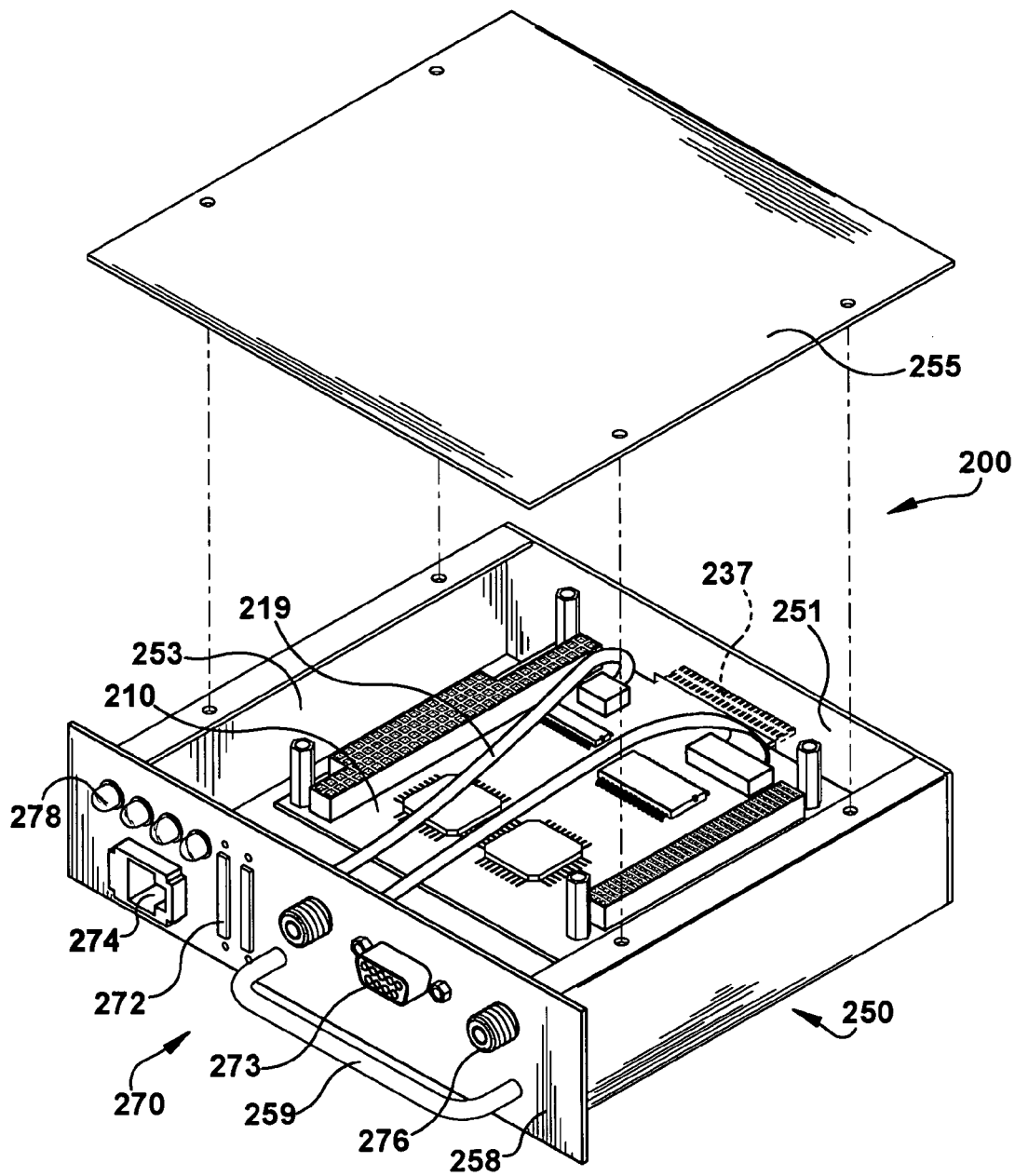
FIG. 3 is a perspective view of an electronic module.

In the illustrated embodiment of FIG. 3, an exemplary module 200 includes a modular device 210 and an enclosure 250, which may be constructed, for example, from sheet metal. The exemplary enclosure 250 includes an open rear portion 251 through which the module's card edge connector 237 extends for connection with the power backplane 120 (FIG. 2). The enclosure 250 may be configured for easy access to the modular device 210 to perform desired maintenance. In the illustrated embodiment, a separate top panel 255 is removably attached to a lower housing 253, such as with machine screws or other fasteners, to provide access to the device 210 for repair or replacement. As standard-based electronic devices, such as PC/104 devices, are provided with uniform dimensions, one enclosure 250 may be used to house many different types of devices 210, without requiring alteration of the external dimensions of the enclosure 250.

Figure 4:
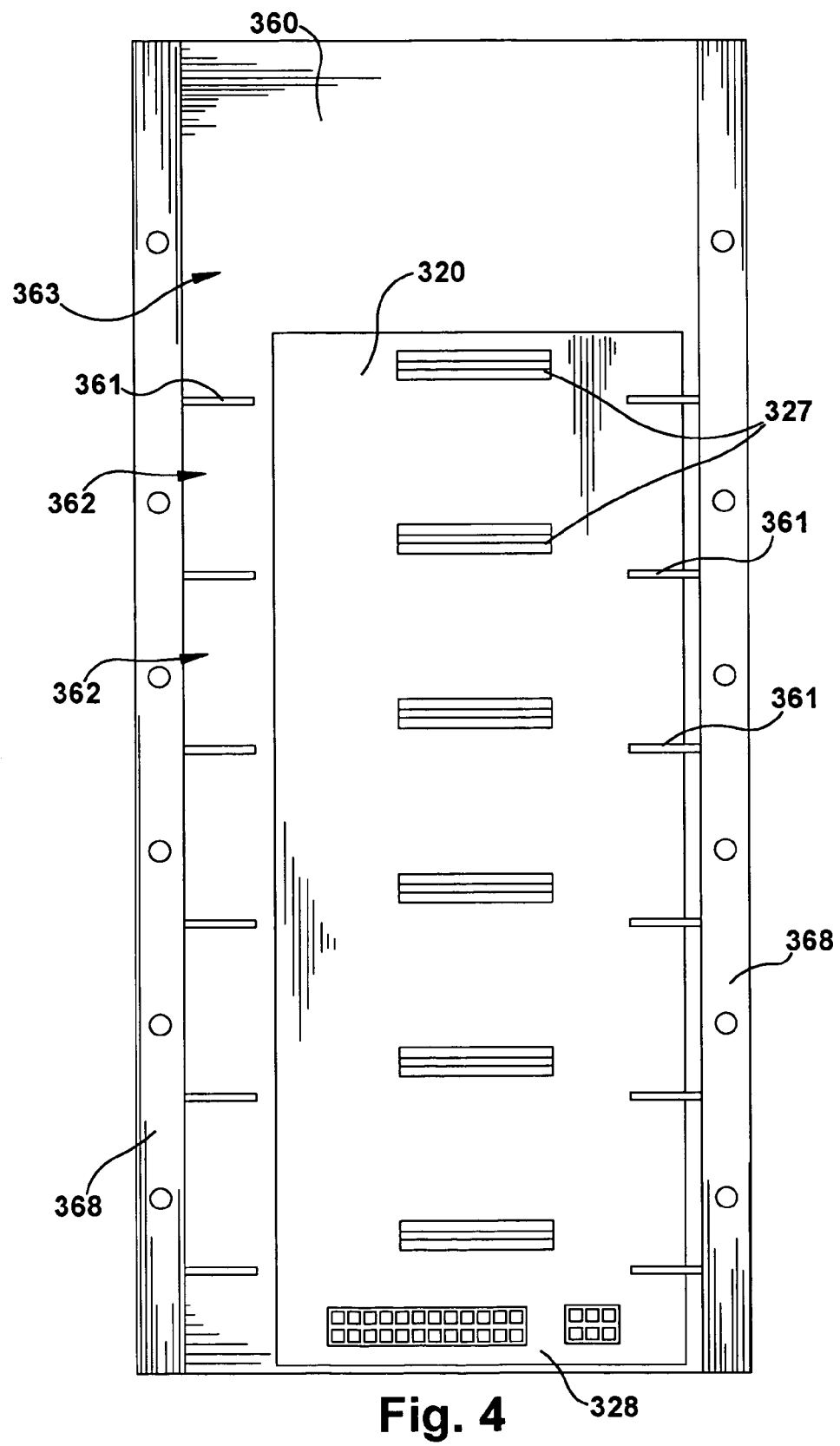
FIG. 4 is a front view of a backplane and mounting frame.

Further, an associated backplane may be adapted to securely receive one or more standard sized modules, by providing uniform compartments or spaces into which the modules may be received. In one such embodiment, a backplane to which one or more modules are to be assembled may be provided with a frame portion, assembled with the backplane, to receive each of the modules and to provide means for securely attaching the modules to the backplane in a connected condition. As shown in the arrangement of FIG. 4, a backplane 320 may be mounted to a frame portion 360 having a series of bays 362 that align with modular power connections 327 in the backplane 320. The bays 362 may be defined, for example, by tabs 361 sized to receive modules 200 (FIG. 3) compartmentally, such that the modular power connector 237 of the module 200 aligns with the modular power connection 327 in the backplane 320. As shown, the tabs 361 form upper and lower guides which may control or orient the module insertion angle, which is shown as being perpendicular to the backplane, but may alternatively be provided at a different angle. Fasteners, such as thumb screws, may be installed through aligned holes in a front panel 258 of the enclosure 250 and in the frame sides 368 to securely attach a module 200 to the backplane 320. As shown in FIG. 3, the front panel 258 of the module 200 may also be provided with a handle 259 to facilitate installation and removal of the module 200 from the frame 360.

In addition to the power connection at the rear portion of each module 200 (for connecting with the backplane), a module may be provided with an interface portion to provide connectivity with other modules 200 in the system, to provide connectivity with devices external to the system, or to provide visual (diagnostic) indicators of conditions within the module. The interface portion may be electrically connected with some or all of the pins and/or sockets of the corresponding circuit board, such as by wiring or adapter cards. The interface portion may be located on any one or more external surfaces of the housing. In the illustrated embodiment, the interface portion 270 is disposed on a front panel 258 of the enclosure 250, opposite the power connection portion 251, thereby allowing for better visibility and access for the end user. Cables 219 are provided to connect the modular device 210 with the exemplary interface portion 270.

Many different types of ports and connectors may be provided with the interface portion 270, including serial ports 272, console ports 273, Ethernet (RJ-45) connectors 274, and RF ports 276, as well as other ports and connectors (not shown), such as USB ports or coaxial connections. Using these interface portion connections, modules may be connected with each other to provide selective data signal interconnectivity between selected modules. By connecting two or more modules in this fashion (as opposed to, for example, data signal connections through the power backplane), incompatible or unrelated modules may be isolated from each other. This arrangement also allows for the removal of a module without disconnecting or interrupting service of the remaining modules. The connections may also be used to connect one or more modules with an external device (not shown), either to supply an electrical signal output or to receive an electrical signal input. Further, visual or diagnostic indicators, such as LED's 278 may be connected with the modular device 210 and disposed on the interface portion 270 for visual indication of device conditions, such as operability or network (such as Ethernet or RF) activity.

Figure 5:
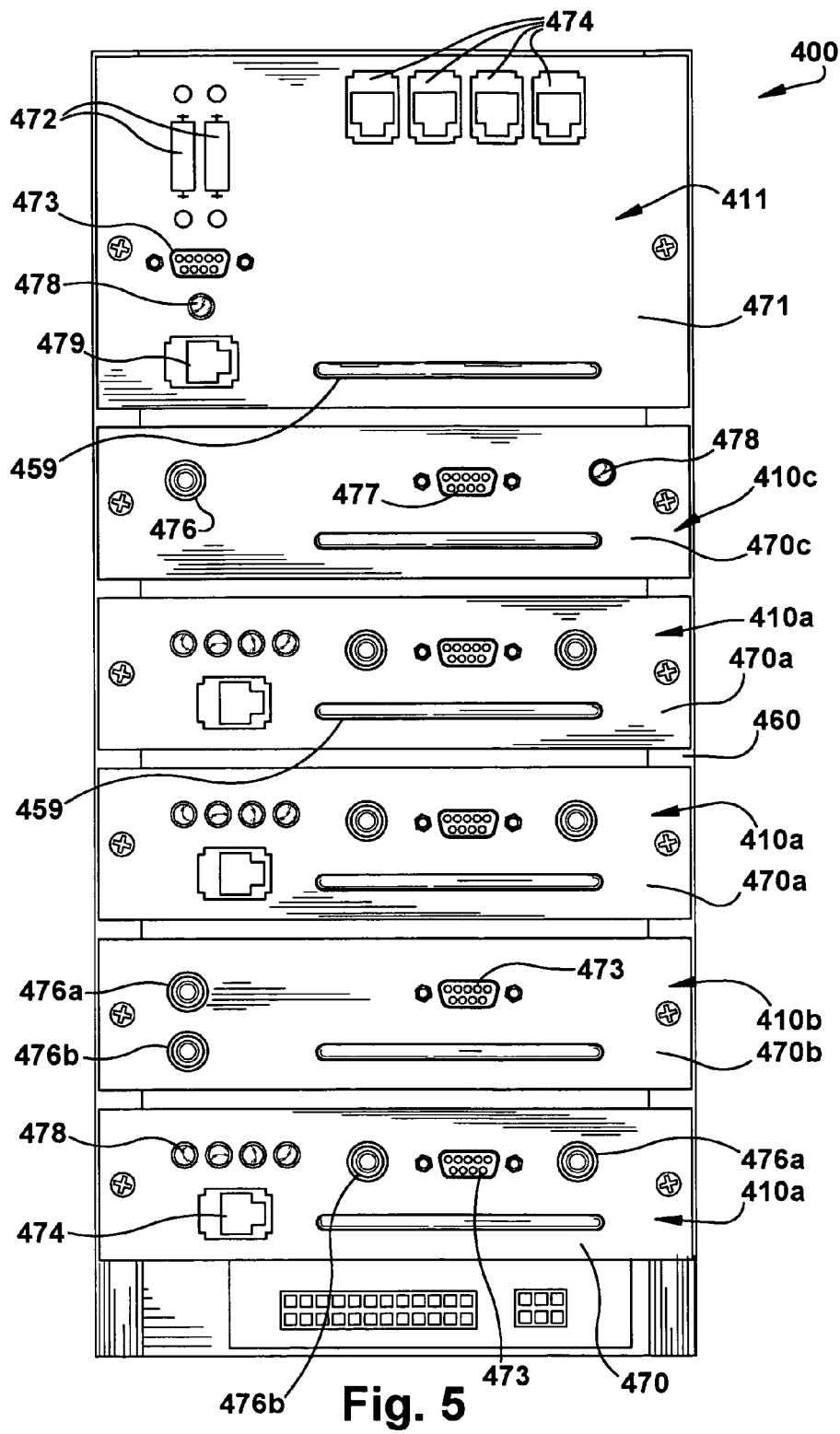
FIG. 5 is a front view of a system with multiple modular electronic devices provided with front interface portions.

FIG. 5 illustrates a front view of an exemplary system 400, such as, for example, a wireless network base station, with multiple modules 410a, 410b, 410c, 411 connected with a power backplane (not visible) and secured to a frame 360 (see FIG. 4). As shown, the interface portions 470a, 470b, 470c, 471 of each module may be configured to best accommodate the enclosed device of that module. For example, an interface portion 470a for a Wireless Mobile Internet Card (WMIC) may include an Ethernet port 474, a console port 473, primary and auxiliary Radio Frequency (RF) ports 476a, 476b, and diagnostic LED's 478. As another example, an interface portion 470b for a video card module may be limited to primary and auxiliary RF ports 476a, 476b, and a console port 473. As yet another example, an interface portion 470c for a cellular modem may include a GPS port 477, an RF port 476, and an LED 478. As still another example, a Mobile Access Router may include multiple Ethernet ports 474, a router console port 473, serial ports 472, a router wide access network (WAN) port 479, and a diagnostic LED 478.

With some circuit board based electronic devices, data signal interconnectivity between two or more devices may be required for proper operation. In such cases, separable external connections between the devices may not be necessary or even desirable. One example is a mobile access router (MAR), such as the Cisco 3200 Mobile Access Router, which requires interconnectivity, or bus signaling, with a Serial Mobile Interface Card (SMIC) and a Fast Ethernet Switch Mobile Interface Card (FESMIC). To provide more permanent connections between such devices, the devices may be stacked by customary PC/104 bus connections or otherwise connected with each other within a single, larger module, as shown at 111 in FIG. 2. As shown in FIG. 4, one or more larger bays 363 may be provided in the frame 360 to accommodate a larger module 111 that includes multiple connected or stacked devices. Further, spacing between modular power connections 327 may be configured to accommodate one or more larger modules. As illustrated in FIG. 2, a corresponding modular adapter card 130 may be assembled with the circuit boards 115 of the end-most device for connection of the stacked module 111 with the backplane 120. As illustrated in FIG. 5, a larger module enclosure 411 may be provided to accommodate a stacked device assembly 111, including a front interface portion 471 electrically connected with electrical contacts (pins and sockets) from one or more of the stacked devices. The front interface portion 471 may be configured to provide external connectivity and diagnostic access to each of the enclosed stacked devices. As one example, the above referenced Mobile Access Router may be provided with an interface portion including a router WAN port and router console port for the MAR card, four switched Ethernet ports for the FESMIC card, and serial ports reserved for future use.

Figure 6:
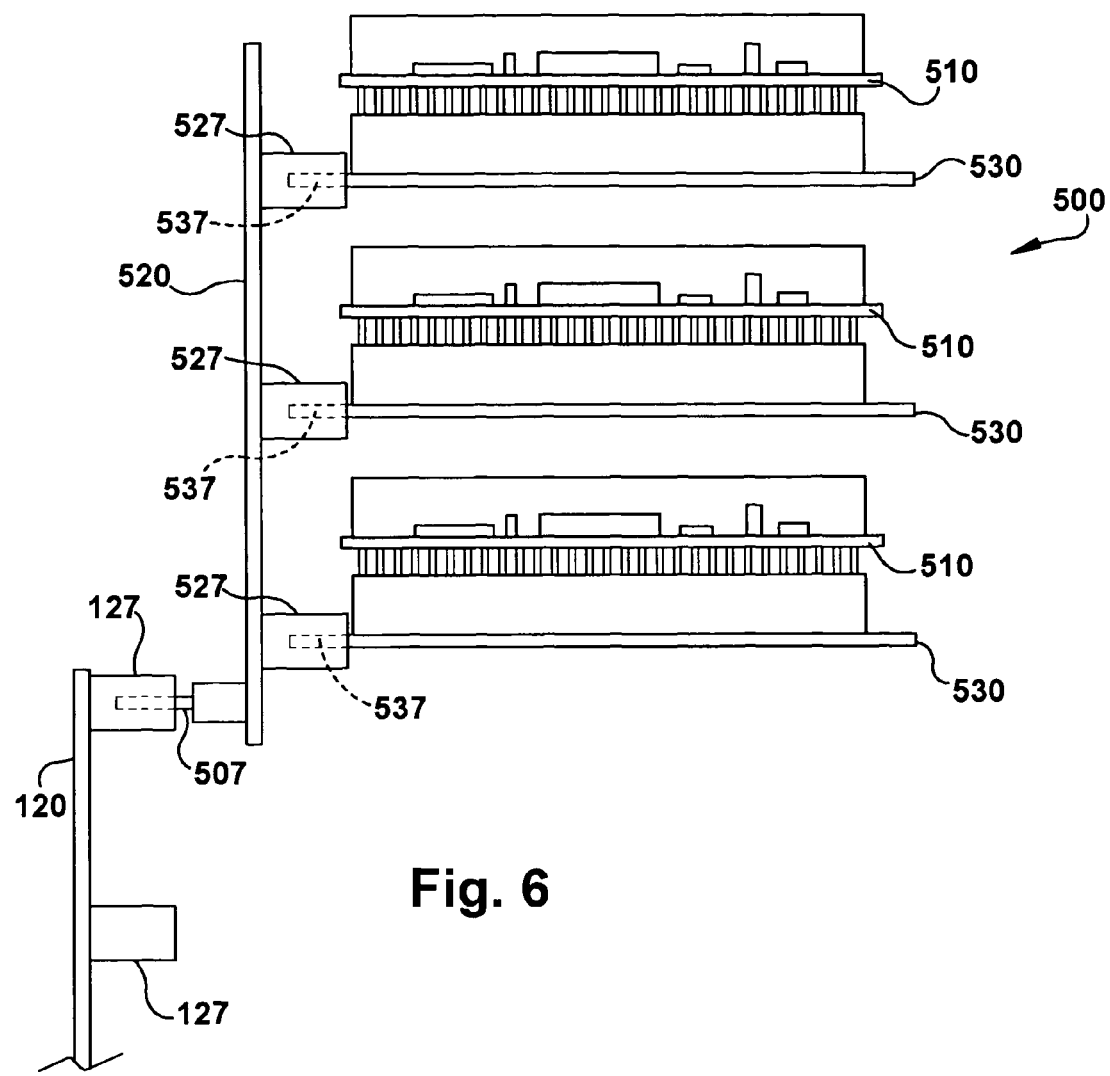
FIG. 6 is a side schematic view of a modular electronic system subassembly.

According to another aspect of the invention, a modular subassembly of interrelated electronic devices may be connected with a sub-backplane adapted to connect with a primary backplane, such as the backplane 120 of FIG. 2. By providing such a subassembly, the interrelated devices may be easily removed or replaced as one unit, or one or more of the individual devices may be easily removed or replaced from the sub-backplane. In one such embodiment, as shown in FIG. 6, a larger module 500 including two or more devices 510 may include a sub-backplane 520, connectable with a modular power connection 127 of a system backplane 120 at modular power connector 507. The sub-backplane 520 may be provided with modular connections 527 to connect with edge connectors 537 of adapter cards 530 connected with each of the devices 510 within the larger module 500 to provide power and/or data connectivity. In such an embodiment, the set of devices 510 may be serviced or replaced by removing the entire larger module 500, by detaching the sub-backplane 520 from the system backplane 120. Alternatively, any one or more of the devices 510 within the larger module 500 may be serviced or replaced by detaching the device or devices 510 from the sub-backplane 520. As with the larger module enclosure 411 for the stacked device 111 (FIG. 2), a similar larger enclosure may be sized to enclose a multiple device with sub-backplane assembly 500.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

What is claimed is:

1. A system for supplying electrical connectivity to one or more circuit board based devices, the system comprising:
   a backplane, comprising a mounting surface including a plurality of modular power connectors; and
   at least one module, comprising:
      an interface portion including at least one connector for electrically connecting the module with an external device;
      at least one module adapter card including a power connection portion connected with a corresponding one of the plurality of modular power connectors of the backplane;
      a circuit board based device including a circuit board connected with the module adapter card, the circuit board based device having a plurality of power related electrical contacts and a plurality of data-related electrical contacts, wherein at least one of the plurality of power-related electrical contacts is in electrical communication with the power connection portion through the module adapter card, and at least one of the data-related electrical contacts is connected with the interface portion,
   wherein the backplane is configured to connect with a power supply, such that the power supply supplies power to the at least one module through one of the modular power connectors when the at least one module is connected with the corresponding modular power connector.

2. The system of claim 1, further comprising a frame portion defining a plurality of bays, wherein each of the plurality of modular power connectors is disposed within a respective one of the plurality of bays, the at least one module being sized to be receivable in one of the plurality of bays.

3. The system of claim 1, wherein the one or more circuit board based devices comprise a wireless communications network.

4. The system of claim 1, comprising first and second modules, wherein the first and second modules are adapted to be connected with each other by cables connecting the interface portion of the first module with the interface portion of the second module.

5. The system of claim 1, wherein the circuit board comprises a PC/104 compliant circuit board.

6. The system of claim 1, wherein the backplane is adapted to connect with a power supply at an ATX style power connector.

7. The system of claim 1, wherein the power connection portion comprises a card edge connector.

8. The system of claim 1, wherein the interface portion comprises at least one of an Ethernet connection, a serial port, an RF connection, and a diagnostic LED.

9. The system of claim 1, wherein at least one of the at least one modules comprises a second backplane connectable with the first stated backplane through the power connection portion and a plurality of circuit boards connected to the power connection portion.

10. The system of claim 1, wherein the mounting surface is disposed on a backplane circuit board.

11. The system of claim 1, wherein the plurality of modular power connectors are wired in parallel with each other.

12. The system of claim 1, wherein the at least one module is adapted to be received in one of a plurality of bays such that the circuit board is substantially perpendicular to the mounting surface.

13. The system of claim 1, wherein one of the at least one modules comprises one of a PC, router, video decoder, memory card, modem, transmitter, transceiver, CPU, digital signal processor, interface card, and power supply.

14. The system of claim 1, wherein the module adapter card includes a set of electrical contacts extending substantially perpendicular from a planar surface of the module adapter card, and the plurality of data-related electrical contacts and the plurality of power related electrical contacts extend substantially perpendicularly from a planar surface of the circuit board for connection with the set of electrical contacts of the module adapter card.

15. The system of claim 2, wherein the at least one module is configured to mechanically attach to the frame portion when the at least one module is received in one of the plurality of bays.

16. The system of claim 2, wherein the at least one module further comprises a housing that encloses the circuit board.

17. The system of claim 16, wherein the interface portion is disposed on an external surface of the housing.

* * * * *